United States Patent [19]

Guyton

[11] 4,418,320

[45] Nov. 29, 1983

[54] HIGH FREQUENCY DISCRIMINATOR WITH A CRYSTAL PHASE SHIFT NETWORK

[76] Inventor: James H. Guyton, 217-A Bobolink Way, Naples, Fla. 33942

[21] Appl. No.: 419,264

[22] Filed: Sep. 17, 1982

Related U.S. Application Data

[63] Continuation of Ser. No. 141,730, Apr. 18, 1980, abandoned.

[51] Int. Cl.³ .............................................. H03D 3/16
[52] U.S. Cl. ................................. 329/118; 329/137; 455/214
[58] Field of Search ............. 329/117, 118, 137, 138, 329/103, 119, 198; 331/116 R; 307/510, 514; 328/141; 333/187; 455/214, 304, 331

[56] References Cited

U.S. PATENT DOCUMENTS

| | | | |
|---|---|---|---|
| 3,160,822 | 12/1964 | Dix | 329/117 |
| 3,475,690 | 10/1969 | Hurtig | 329/117 |
| 3,875,533 | 4/1975 | Irwin et al. | 331/116 R |
| 4,006,424 | 2/1977 | Pond | 329/117 |

*Primary Examiner*—Siegfried H. Grimm
*Assistant Examiner*—Edward P. Westin
*Attorney, Agent, or Firm*—Reising, Ethington, Barnard, Perry & Milton

[57] ABSTRACT

A high frequency discriminator is disclosed with a phase shift circuit using a piezoelectric crystal and a series connected load resistor. The voltage across the load resistor is shifted in phase an amount corresponding to the deviation of the input signal voltage from its center frequency. This phase shifting circuit may be connected in cascade with a 90° phase shift circuit to produce the quadrature voltage for the discriminator. The discriminator provides very low distortion in the output.

6 Claims, 5 Drawing Figures

HIGH FREQUENCY DISCRIMINATOR WITH A CRYSTAL PHASE SHIFT NETWORK

This is a continuation of application Ser. No. 141,730, filed Apr. 18, 1980, now abandoned.

FIELD OF THE INVENTION

This invention relates to discriminators for frequency modulated (FM) and phase modulated (PM) waves; more particularly, it relates to means for producing a phase shift as a function of frequency deviation from a predetermined center frequency.

BACKGROUND ART

In the design of narrow band FM receivers for VHF and UHF signals, it would be desirable to use a superheterodyne circuit with a single intermediate frequency stage. However, this results in an intermediate frequency in the high frequency spectrum, such as 10 to 60 megahertz (Mhz). At such high intermediate frequencies, it has been expensive to build coil and condenser filters which will reject stations on adjoining channels. Further, at such high intermediate frequencies, conventional discriminator circuits for converting the frequency modulation into an audio output signal produce very low audio voltages and exhibit an unacceptable drift in its tuning adjustment. Heretofore, these problems have been averted by an FM receiver design with double or triple frequency conversion so that the final intermediate frequency is reduced to a few hundred kilohertz (Khz) where the desired selectivity and discriminator output and stability can be realized. Such a receiver design is relatively complicated and costly.

It is therefore desirable, to provide a narrow band FM receiver for the VHF and UHF bands which has a high intermediate frequency such as that which may be produced by a single frequency conversion. The desired selectivity at the high intermediate frequency can be provided by the use of low cost piezoelectric filters. There has remained however a problem of providing an FM discriminator which will provide a high level audio output and good tuning adjustment stability in a simple low cost circuit.

In the prior art, there are several well known types of FM and PM discriminators which used inductance-capacitance or tuned transformers to generate a quadrature voltage which is 90° out of phase with the signal voltage at the center frequency and which is shifted in phase as the signal deviates from the center frequency. In the Foster-Seeley discriminator and in the ratio detector, the quadrature voltage is generated by a discriminator transformer.

Also in the prior art, it has been proposed to utilize a piezoelectric crystal in FM and PM discriminator circuits to obtain an audio output voltage having an amplitude which varies with frequency deviation of the modulated wave. In the Crosby U.S. Pat. No. 2,156,376, a crystal and a neutralizing capacitor are used in a discriminator circuit which develops opposed voltages which are combined to produce the discriminator output. Similar arrangements are shown in the Crosby U.S. Pat. Nos. 2,158,276; 2,397,840; 2,397,841; and 2,425,924. The Dix U.S. Pat. No. 3,160,822 discloses a narrow band FM discriminator which uses the voltage developed across a crystal at a point off resonance. The Nagata et al. U.S. Pat. No. 4,013,970 discloses a similar arrangement. Th discriminator circuits of these patents include a piezoelectric crystal in a circuit which utilizes voltage amplitude variations across the crystal as a function of frequency of the input signal voltage.

A general object of this invention is to provide an improved discriminator for FM and PM waves which overcomes certain disadvantages of the prior art.

SUMMARY OF THE INVENTION

In accordance with this invention, a discriminator for developing an audio voltage in a receiver for angle modulated waves, i.e. either FM or PM, is provided with a phase shift means which produces a larger phase shift of the quadrature voltage with small frequency deviations of the signal voltage. This provides a relatively high output voltage and good linearity of voltage output as a function of frequency deviation of the signal voltage. This is accomplished by a discriminator circuit wherein two phase shifting circuits are connected in cascade so that their phase shifts are additive. One of these circuits produces a phase shift of 90° and has an insignificant change of this phase shift with signal deviations of a few Khz. The other phase shifting circuit includes a piezoelectric crystal and a load resistor connected in series. The piezoelectric crystal is series resonant at a frequency substantially equal to the signal frequency and a modified signal voltage appears across the load resistor which will have no phase shift with respect to the input voltage to the crystal resonator at center frequency but will have a substantial phase shift as the modulated signal departs from center frequency. The output of the cascaded phase shifting circuits is the quadrature voltage which is applied to the detector means to develop the audio voltage corresponding to the modulation of the signal voltage.

Further, according to this invention, a discriminator is provided which exhibits a substantially linear output voltage as a function of frequency deviation of the signal voltage over a wide dynamic range. This is accomplished by the aforesaid crystal phase shift circuit together with means for eliminating the adverse effect of distributed capacitances across the crystal terminals and between the crystal terminals and ground. In particular, inductances are added in parallel with these distributed capacitances, to provide antiresonant circuits which linearize the output.

A more complete understanding of this invention may be obtained from the detailed description that follows taken with the accompanying drawings.

BEST MODE FOR CARRYING OUT THE INVENTION

Figure 1:
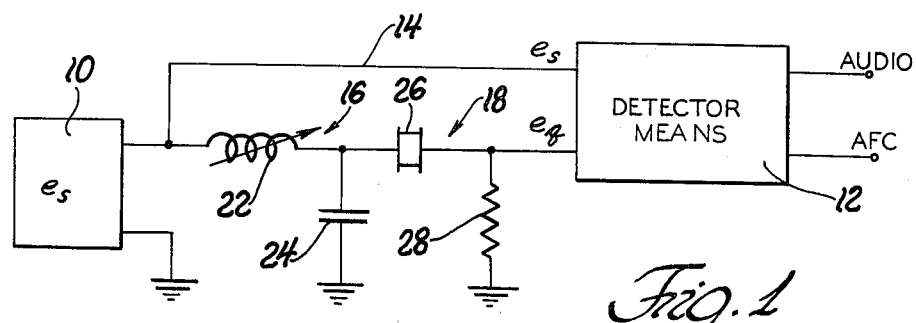
FIG. 1 is a diagram of one embodiment of the detector of this invention.

Referring now to the drawings, there is shown an illustrative embodiment of the invention in a high frequency discriminator for an FM receiver in the UHF or VHF band. It will be appreciated, as the description proceeds, that the invention is useful in discriminators for angle modulated waves, either FM or PM, and is especially adapted for high frequency demodulation.

The FM discriminator of this invention utilizes a piezoelectric device, a load resistor, and a 90° phase shifting circuit to develop a quadrature voltage for phase comparison with the signal voltage. In the illustrative embodiment, the signal voltage at the discriminator has a center frequency of 10.695 Mhz. One embodiment of the discriminator is shown in FIG. 1. In general, this circuit comprises a signal voltage source 10 which, for example, may be the intermediate frequency stage of a superheterodyne receiver. The signal voltage $e_s$ is a frequency modulated voltage which deviates about a center frequency according to the modulation. The signal voltage is applied directly to one input of a detector means 12 through a conductor 14. A quadrature voltage $e_q$ is derived from the signal voltage by a 90° phase shift network 16 and a crystal phase shift network 18 which are connected in cascade between the signal voltage source and another input to the detector means 12. It will be understood that detector means 12 may be one of several different types of detector circuits such as those which are commonly used in FM discriminators. The detector means 12 is adapted to produce an audio voltage output corresponding to the phase variation of the quadrature voltage $e_q$ with respect to the signal voltage $e_s$. It is also adapted to produce an automatic frequency control (AFC) voltage which is a DC voltage corresponding to phase variations of the quadrature voltage.

The 90° phase shift network 16 comprises an inductor 22 and a capacitor 24 connected in series across the signal voltage source. The inductor 22 and capacitor 24 are approximately series resonant at the center frequency of the signal voltage. An output voltage from the network 16 is derived across the capacitor 24. The network 16 produces a rise in the output voltage and a phase shift of 90° at the center frequency of the signal voltage. This output voltage is applied to the input of the crystal phase shift network 18.

The crystal phase shift network 18 comprises a piezoelectric crystal 26, preferably a quartz crystal, which is series resonant at or near the center frequency of the signal voltage. It exhibits a reactance change of 50 to a few hundred ohms for each Khz departure of the signal voltage from the center frequency. The piezoelectric device 26 is connected in series with a load resistor 28 which has a resistance of a few thousand ohms. An output voltage $e_q$ referred to as the quadrature voltage, is derived from the phase shift network 18 across the resistor 28. The quadrature voltage is phase shifted by the network 18 by a phase angle which corresponds with the frequency deviation of the signal voltage from the center frequency.

Figure 2:
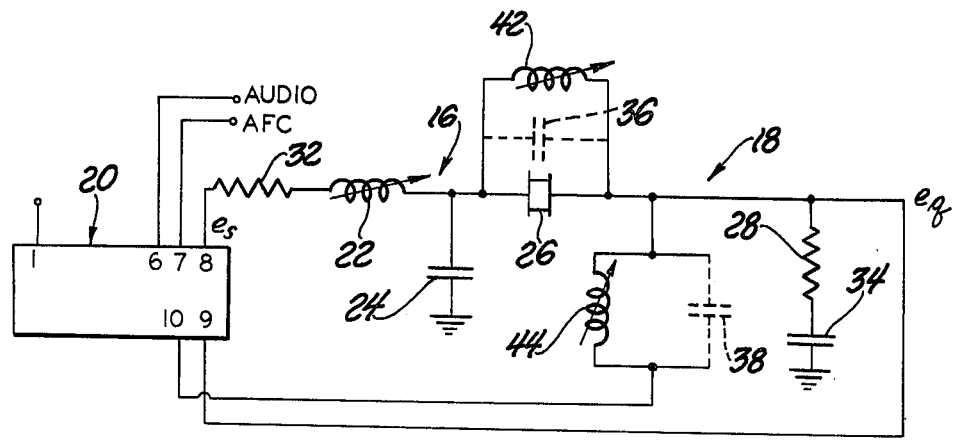
FIG. 2 is a schematic diagram of a second embodiment of the detector of this invention.

The phase shift circuits 16 and 18 in the cascade connection just described develop the quadrature voltage $e_q$ from the signal voltage $e_s$. The phase shift network 16 produces a phase shift of substantially 90° over the frequency range of operation, the phase shift being 90° at the center frequency and departing therefrom by a insignificant amount at the greatest frequency deviation (±4 Khz is allowed by FCC regulations for narrow band FM). The crystal phase shift network 18 produces a phase shift which varies substantially linearly with the frequency deviation of the signal voltage from center frequency. Accordingly, the quadrature voltage $e_q$ has a 90° phase shift at the center frequency of the signal voltage and has a phase shift of 90° plus or minus a phase angle corresponding to the deviation of the signal frequency from center frequency. The discriminator shown in FIG. 1 is quite satisfactory for many applications; however, it does produce a distortion level somewhat greater than that desired in equipment other than low cost receivers. The audio distortion arises from a non-linear relationship between the phase shift of the crystal phase shift circuit 18 and the frequency deviation of the signal voltage. FIG. 2 shows a discriminator circuit similar to that of FIG. 1 but with means for correcting the nonlinearity. The nonlinearity of the circuit of FIG. 1 can be traced to the effects of small distributed capacitances having a value of about one to five pf which are incurred in assembling the circuit components and in fabricating the crystal and its holder.

The circuit of FIG. 2 is the same as that illustrated in FIG. 1 except as noted in the following description. A multiple function microcircuit 20 is used in the circuit of FIG. 2 to serve the function of the signal voltage source 10 and the detector means 12 in the circuit of FIG. 1. This microcircuit is suitably a CA 3089 available from RCA. The microcircuit 20 provides, among other features, an intermediate frequency (IF) signal amplifier and a limiter with low impedance output appearing at pin 8 at which the signal voltage $e_s$ is developed. It also provides a quadrature detector. A quadrature voltage $e_q$ is developed from the signal voltage by the phase shift circuits 16 and 18 and applied to pin 9 and the microcircuit develops a voltage change at pin 6 which is proportional to the phase shift of the quadrature voltage from 90°. Thus, an audio signal voltage is developed on the output pin 6. Additionally, an AFC voltage is developed by the microcircuit on pin 7. The circuit of FIG. 2 also includes a resistor 32 connected in series with the inductor 22 to prevent the circuit from overdriving pin 9 with the quadrature voltage. A DC blocking capacitor 34 is connected in series with the load resistor 28 to block any DC voltage from the quadrature voltage.

Figure 3:
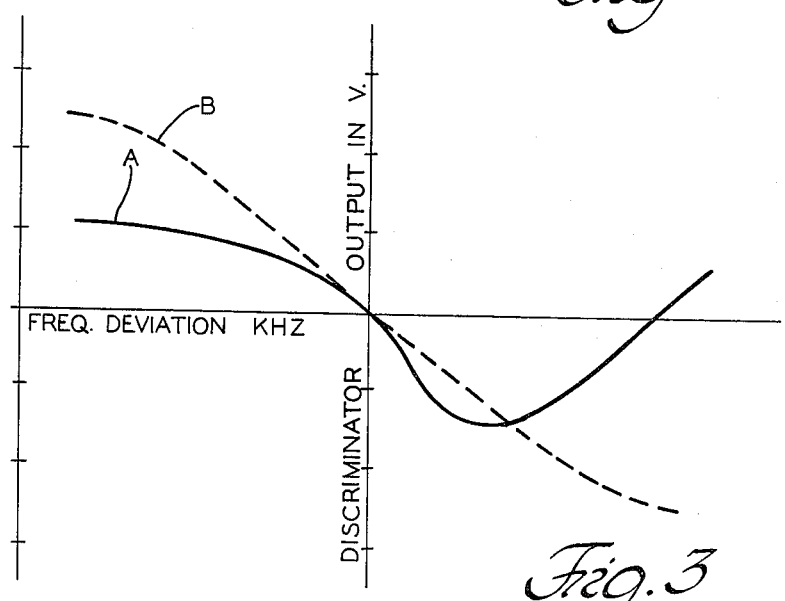
FIG. 3 shows the discriminator curves for the circuits of FIGS. 1 and 2.

The discriminator circuit of FIG. 2 is also provided with means for eliminating the effect of the above mentioned distributed capacitances and thus providing substantial improvement in the linearity of the output. In the circuit of FIG. 2, a distributed capacitance 36 appears between the terminals of the piezoelectric crystal 26. Also, a distributed capacitance 38 appears between the output terminal of the crystal 26 and ground, i.e. the RF ground at pin 10 of the microcircuit 20. Since the input terminal of the crystal 26 is connected across capacitor 24, the distributed capacitance of this terminal has a negligible effect. The distributed capacitance 38 tends to resonate with the inductive reactance of the crystal 26 and the distributed capacitance 36 tends to antiresonate with the inductive reactance of the crystal at frequencies above crystal resonance. This causes the phase shift produced by the crystal phase shift circuit 18 to shift more rapidly above resonance than it does below resonance; this gives rise to a nonlinear output voltage of the discriminator as represented by curve A of FIG. 3.

In order to eliminate the adverse effect of the distributed capacitances 36 and 38, inductors are added which combine with the distributed capacitances to form antiresonant networks. An inductor 42 is connected across the terminals of the crystal 26 and is of such value that it coacts with the distributed capacitance 36 to form an antiresonant network at the center frequency of the signal voltage. Similarly, an inductor 44 is connected between the output terminal of the crystal 26 and the RF ground at pin 10 of the microcircuit. This inductor 44 is of such value that it coacts with the distributed capacitance 38 to form an antiresonant circuit at the center frequency of the signal voltage. These antiresonant networks exhibit an extremely high impedance over the frequency range of interest, i.e. the total deviation of the signal voltage. As a result, the phase shift of the quadrature voltage is a substantially linear function of frequency deviation. For example, if the inductors 42 and 44 have a Q of 25 to 50 and the distributed capacities 36 and 38 are reasonably low, (i.e. 5 to 10 pf), the reactance of the crystal phase shift circuit will be linear within one percent over a range of 50 Khz at a frequency of 10.695 Mhz. The circuit of FIG. 2, with the inductors 42 and 44, produces a substantially linear output voltage from the discriminator, as illustrated by curve B of FIG. 3 and audio distortion is a small fraction of 1%.

Figure 4:
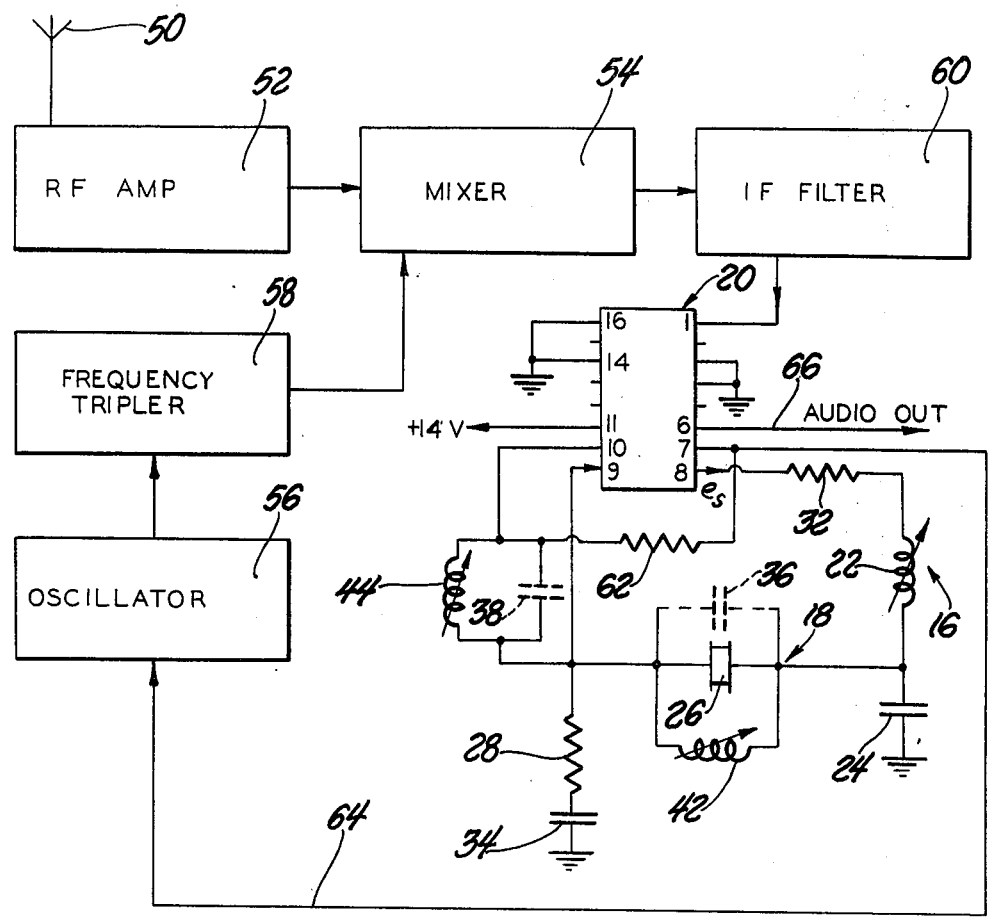
FIG. 4 shows the detector circuit of this invention in a radio receiver.

FIG. 4 shows the circuit diagram of an FM broadcast receiver, in particular, a single conversion receiver for voice transmissions. This receiver is adapted for reception of weather service signals at 162.475 Mhz having a maximum deviation of 4 Khz. The receiver has an intermediate frequency of 10.695 Mhz. The discriminator circuit of FIG. 2 is incorporated into this receiver.

The receiver comprises an antenna 50 coupled to an RF amplifier 52 which is tuned to the carrier wave frequency of 162.475 Mhz. The amplifier output is applied to one input of a mixer 54 which is adapted to produce the intermediate frequency of 10.695 Mhz. A crystal oscillator 56 operates at the frequency of 57.723 Mhz and the output thereof is applied through a frequency tripler 58 to the other input of mixer 54. The output of the mixer is applied to a piezoelectric IF band pass filter 60 having a center frequency of 10.695 Mhz. The output of the filter 60 is applied to pin 1 of the microcircuit 20, which is the same as that described with reference to FIG. 2. The microcircuit 20 amplifies and limits the IF signal and produces the signal voltage $e_s$ at the output pin 8. The signal voltage $e_s$ is applied through the 90° phase shift network 16 and through the crystal phase shift network 18 in cascade to develop the quadrature voltage $e_q$ which is applied to the input pin 9 of the microcircuit 20. The phase shift networks 16 and 18 are the same as described with reference to FIG. 2. The microcircuit 20 develops an AFC voltage on output pin 7 across a resistor 62 which is connected to RF ground at pin 10 of the microcircuit. The AFC voltage is applied through a conductor 64 to the frequency control input of the crystal oscillator 56. The audio output voltage is developed by the microcircuit 20 on the output pin 6 and is applied through a conductor 66 to the audio stages (not shown) of the receiver.

The embodiment of the invention shown in FIG. 2 is preferably implemented using circuit components as set forth below:

| Integrated circuit 20 | RCA CA 3089 E |
|---|---|
| Resistor 32 | 330 ohms |
| Resistor 28 | 2200 ohms |
| Inductor 22 | 6 microhenries |
| Inductor 42 | 40 microhenries |
| Inductor 44 | 22 microhenries |
| Capacitor 24 | 39 picofarads |
| Capacitor 34 | .0015 microfarads |
| Capacitor 36 | 5.5 picofarads |
| Capacitor 38 | 10.0 picofarads |
| Piezoelectric Crystal 26 | A circular AT cut quartz crystal element approximately 0.17 mm thick and 8 mm in diameter mounted in an HC 25/U holder and series resonant in the fundamental mode at 10.695 Mhz available from Bob Whan and Son, Inc., 2400 Crystal Drive, Fort Myers, Florida. |

For discriminators operating at higher frequencies, crystal resonators having dimensions similar to the resonator described above can resonate in a third or fifth overtone mode at approximately 30 Mhz or 50 Mhz respectively and can be used at these frequencies if the circuit values of FIG. 1 and FIG. 2 are appropriately chosen.

Similar quartz resonators are commercially available which have the 8 mm diameter and are only half as thick. These resonators will have a series resonance of approximately 20 Mhz in the fundamental mode and 60 Mhz and 100 Mhz in the third and fifth overtone modes. These thinner crystals have much lower resistance at resonance but exhibit only 50 to 70 ohms reactance for each Khz the signal departs from center resulting in a greatly reduced audio output voltage from the circuits shown in FIG. 1 and FIG. 2.

Figure 5:
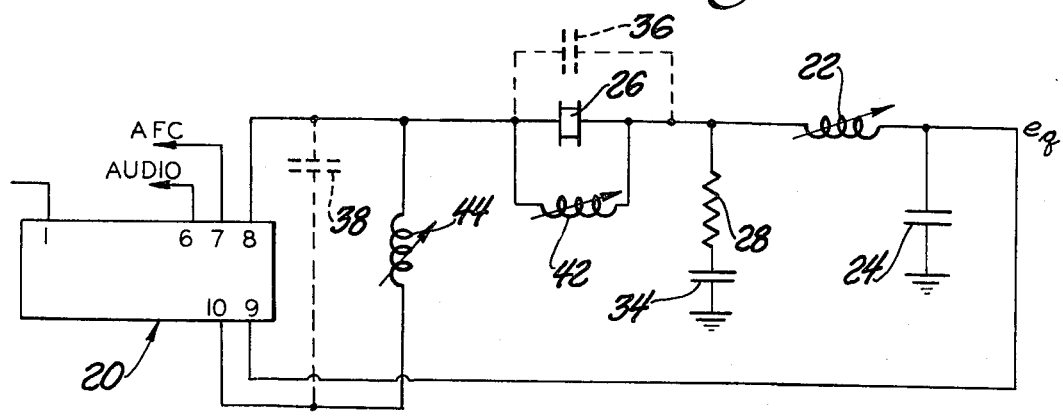
FIG. 5 is a schematic diagram of a third embodiment of the invention.

Such low impedance resonators will produce as much audio voltage from the discriminator as the thicker crystals if the phase shifting networks 16 and 18 are reversed allowing the resonator to operate out of the low output impedance of the microcircuit 20 and into a lower impedance load resistance. FIG. 5 shows such a circuit for use with a circular AT cut crystal approximately 0.08 mm thick and resonating in the fundamental mode at 20.000 Mhz. Components in FIG. 5 are numbered so that their function corresponds to the function of the component with the same number in FIG. 2.

The embodiment of the invention as shown in FIG. 5 is preferably implemented using circuit components as set forth below:

| Integrated circuit 20 | RCA CA 3089 E |
|---|---|
| Resistor 32 | 0 ohms |
| Resistor 28 | 1400 ohms |
| Inductor 22 | 6.3 microhenries |
| Inductor 42 | 8.2 microhenries |
| Inductor 44 | 4.0 microhenries |
| Capacitor 24 | 10 picofarads |
| Capacitor 34 | .0015 microfarads |
| Capacitor 36 | 7.5 picofarads |
| Capacitor 38 | 14.0 picofarads |
| Piezoelectric Crystal 26 | "AT" element in an HC 25/U holder, series resonant in the fundamental mode at 20.000 Mhz approximately 8 mm in diameter and 0.08 mm thick. It is available from Bob Whan and Son, Inc., 2400 Crystal Drive, Fort Myers, Florida. |

For some frequencies, the characteristics of low impedance quartz crystals are such that no 90° phase shifting circuit is required in cascade with the crystal phase shifting circuit. This may be accomplished with the circuit of FIG. 5 modified as follows: the inductor 22 is eliminated and crystal 26 has a series resonant frequency a few Khz below the operating frequency so that the inductive reactance of the circuitry consisting of crystal 26, inductor 42 and distributed capacity 36 will equal the capacitive reactance of capacitor 24 at the operating frequency.

Under these conditions, the quadrature voltage will appear across resistor 28 and capacitor 24 and no further phase shift will be necessary.

Such a circuit may have the same values as those listed above with reference to FIG. 5 with the following exceptions:

| | |
|---|---|
| Inductor 22 | 0 microhenries |
| Resistor 28 | 2000 ohms |
| Capacitor 24 | 5 picofarads |
| Crystal 26 | has the same |
| specifications listed above for FIG. 5 except its series resonance is at 19.990 Mhz for system operation at 20.000 Mhz. | |

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. For use in developing an audio voltage in a receiver for angle modulated waves, said receiver including signal developing means for developing a signal voltage in the frequency range of at least several Mhz which is deviated about a center frequency by a deviation of several Khz in accordance with the modulation of the modulated wave; a discriminator circuit of the type adapted to combine the signal voltage and a quadrature voltage and having an input adapted to be coupled with said signal developing means, a crystal phase shift network in the discriminator circuit including a piezoelectric crystal and additional reactance means including distributed capacitance, said crystal with the additional reactance means having a reactance which is linearly proportional to signal deviation from center frequency, said phase shift network also including, in series with said crystal, a series impedance comprising reactance which includes distributed capacitance, the series impedance being resistance, said crystal being resonant at a frequency within a few Khz of said center frequency, whereby a modified signal voltage is produced across said series impedance, said modified signal voltage having a phase shift relative to said signal voltage which is linearly proportional to the deviation of said signal voltage frequency from said center frequency and means coupled with the crystal phase shift network for shifting the phase of the modified signal voltage by an additional 90° to produce said quadrature voltage, whereby said quadrature voltage is in quadrature phase relation with said signal voltage when the signal voltage is at said center frequency.

2. The invention as defined in claim 1 wherein said means is a 90° phase shift network coupled in cascade with the crystal phase shift network said 90° phase shift network being adapted to produce 90° of phase shift.

3. The invention as defined in claim 1 including an inductor connected across the terminals of said piezoelectric crystal, said inductor having an inductance of such value that it forms an antiresonant circuit at said center frequency with the capacitance between said terminals.

4. The invention as defined in claim 1 wherein said series impedance is a resistor and wherein said series impedance includes an inductor connected between one terminal of said piezoelectric crystal and ground, said inductor having an inductance of such value that it forms an antiresonant circuit at said center frequency with the distributed capacitance between said terminal and ground.

5. The invention as defined in claim 2 wherein said 90° phase shift circuit has its input coupled with the input of said discriminator circuit and has its output coupled with the input of the crystal phase shift circuit.

6. The invention as defined in claim 2 wherein said crystal phase shift network has its input coupled with the input of said discriminator circuit and has its output coupled with the input of said 90° phase shift network.

* * * * *